United States Patent
Kamphaus

(10) Patent No.: US 10,615,689 B2
(45) Date of Patent: Apr. 7, 2020

(54) IN-LINE BYPASS MODULE AND LINE DROP COMPENSATING POWER CONVERTER

(71) Applicant: ABB Schweiz AG, Baden (CH)

(72) Inventor: Brandon Michael Kamphaus, Wylie, TX (US)

(73) Assignee: ABB SCHWEIZ AG, Baden (CH)

( * ) Notice: Subject to any disclaimer, the term of this patent is extended or adjusted under 35 U.S.C. 154(b) by 22 days.

(21) Appl. No.: 16/059,614

(22) Filed: Aug. 9, 2018

(65) Prior Publication Data

US 2020/0052587 A1    Feb. 13, 2020

(51) Int. Cl.
| | |
|---|---|
| H05K 7/14 | (2006.01) |
| H02M 3/156 | (2006.01) |
| H05K 5/00 | (2006.01) |
| H02M 1/00 | (2006.01) |

(52) U.S. Cl.
CPC .......... H02M 3/156 (2013.01); H05K 5/0021 (2013.01); H05K 7/1428 (2013.01); *H02M 2001/0025* (2013.01)

(58) Field of Classification Search
CPC .......... H02M 7/49; H02M 7/25; H02M 3/156; H02M 2001/0025; H05K 7/1427; H05K 7/1428; H05K 7/1432; H05K 7/1457; H05K 5/0021; H04M 19/008; H02J 9/061; H02J 9/068
See application file for complete search history.

(56) References Cited

U.S. PATENT DOCUMENTS

| | | |
|---|---|---|
| 4,313,081 A | 1/1982 | Smith |
| 5,117,174 A | 5/1992 | Kessler |
| 6,025,703 A | 2/2000 | Bjorkengren |
| 7,489,532 B2 | 2/2009 | Shih |
| 7,800,339 B2 | 9/2010 | Gonzalez et al. |
| 8,232,987 B2 | 7/2012 | Park et al. |
| 8,648,563 B2 | 2/2014 | Osswald |
| 9,203,266 B2 | 12/2015 | Wan |
| 9,947,273 B2 | 4/2018 | Meng et al. |
| 9,959,812 B2 | 5/2018 | Hwang et al. |
| 2017/0244249 A1 | 8/2017 | Marinus et al. |
| 2017/0309213 A1 | 10/2017 | Roh et al. |
| 2018/0212532 A1* | 7/2018 | Guo .......................... H02M 7/25 |
| 2018/0212535 A1* | 7/2018 | Xia ........................... H02M 7/49 |
| 2018/0213091 A1* | 7/2018 | Kostakis ................. H02M 3/156 |
| 2019/0064898 A1* | 2/2019 | Nommensen ......... H05K 7/1457 |

* cited by examiner

*Primary Examiner* — Gary L Laxton
*Assistant Examiner* — Jye-June Lee
(74) *Attorney, Agent, or Firm* — Barnes & Thornburg LLP

(57) ABSTRACT

A system for compensating a voltage line drop includes a shelving unit comprising at least one receiving port, wherein the at least one receiving port includes a connector. The system also includes a power converter operable to generate a line drop compensated output voltage, and a bypass module physically coupled between the connector and the power converter, wherein the bypass module is operable to selectively switch between providing the line drop compensated output voltage from the power converter to a load and bypassing the power converter to provide an uncompensated output voltage to the load.

17 Claims, 5 Drawing Sheets

US 10,615,689 B2

IN-LINE BYPASS MODULE AND LINE DROP COMPENSATING POWER CONVERTER

BACKGROUND

The subject matter disclosed herein relates generally to an in-line bypass module and line drop compensating power converter and, more particularly, to a system of in-line bypass modules and line drop compensating power converters.

Line drop compensating power converters are known. Many such power converters are arranged to convert an input voltage to a line drop compensated output voltage, such as, for example, by incrementally increasing the input voltage to compensate for a voltage line drop between the line drop compensated power converter and a load. In other words, many conventional line drop compensating power converters are arranged to boost an input voltage by a voltage dropped during transmission on a power line.

In some cases, one or more line drop compensating power converters may be physically arranged in a system of such converters to supply a plurality of line drop compensated output voltages to a plurality of loads. Example loads may include one or more radio transceivers of one or more cellular communications systems. As the power requirements of such systems continue to increase, corresponding increases in the power densities of line drop compensating power converters may also be desirable.

BRIEF DESCRIPTION

In one aspect, a system for compensating a voltage line drop is provided. The system includes a shelving unit including at least one receiving port, wherein the at least one receiving port includes a connector. The system also includes a power converter operable to generate a line drop compensated output voltage, and a bypass module physically coupled between the connector and the power converter, wherein the bypass module is operable to selectively switch between providing the line drop compensated output voltage from the power converter to a load and bypassing the power converter to provide an uncompensated output voltage to the load.

In another aspect, a bypass module for use with a power converter is provided. The bypass module is arranged to physically engage in-line between a connector of a shelving unit and the power converter. The bypass module includes a first side configured to receive an input voltage from a power supply, a second side configured to receive a line drop compensated output voltage from the power converter, and a bypass switch electrically coupled between the first side and the second side, wherein the bypass switch is operable to selectively switch between directing the line drop compensated output voltage from the power converter to a load and bypassing the power converter to direct an uncompensated output voltage to the load.

In yet another aspect, a method for physically interposing a bypass module between a connector of a shelving unit and a power converter is provided. The method includes slidably coupling a first side of the bypass module to the connector of the shelving unit, and slidably coupling the power converter to a second side of the bypass module. The bypass module includes a bypass switch electrically coupled between the first side of the bypass module and the second side of the bypass module. The bypass switch is configured to relay an input voltage received from a power supply from the first side to the second side for conversion by the power converter to a line drop compensated output voltage. The bypass switch is further configured to relay the line drop compensated output voltage received from the power converter to the first side when the power converter is functional. The bypass switch is further configured to relay the input voltage received from the power supply as an uncompensated output voltage back to the first side in response to a loss of functionality of the power converter.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, a "line drop voltage" is any voltage dropped or lost on an electrical wire as a result of an impedance on the wire. For example, a load coupled to a power source through an electrical wire (or wires) may see a voltage less than a voltage supplied by the power source as a result of a voltage line drop along the wire connecting the load to the power source.

Embodiments of the present disclosure relate to a power-dense system of in-line bypass modules and line drop compensating power converters. In at least some embodiments, a shelving unit may receive and support a plurality of in-line pairs of bypass modules and line drop compensating power converters. Each bypass module may be configured to relay an input voltage received from an external power source to each line drop compensating power converter for conversion to a line drop compensated output voltage, which may be supplied to one or more loads. In the event that one or more line drop compensating power converters suffers a loss of functionality, the affected line drop compensating power converter(s) may be easily removed and/or replaced, and the input voltage received by the bypass module from the external power source may be provided to the load or loads supplied by the affected power converter(s).

Figure 1:
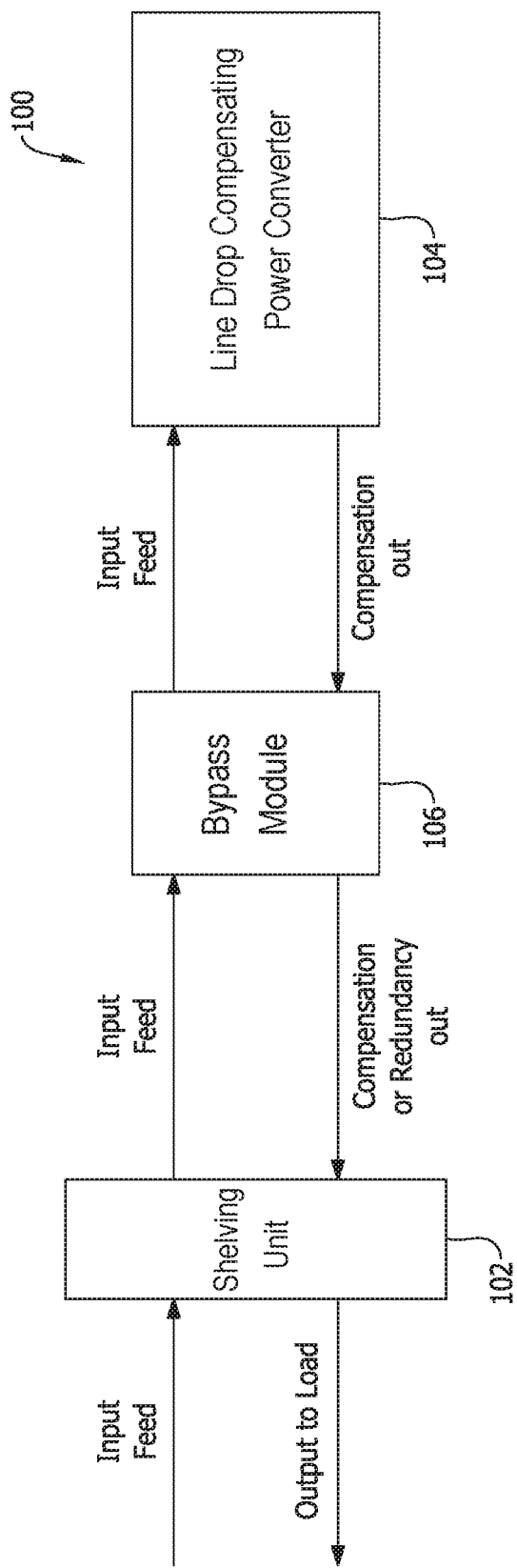
FIG. 1 is a block diagram of an exemplary system for compensating a line drop voltage.

FIG. 1 is a block diagram of an exemplary system 100 for compensating a line drop voltage. In the exemplary embodiment, system 100 includes a shelving unit 102, a line drop compensating power converter 104, and a bypass module 106. As described herein, system 100 may supply an output voltage to a load (not shown), such as a radio of a cellular communications system (e.g., a radio of a cell tower). An electrical wire (or wires, not shown) may connect system 100 to the load.

During operation, some portion of the output voltage may be dropped or lost on the electrical wire (e.g., as a result of an impedance of the electrical wire). As described herein, system 100 therefore compensates for the voltage line drop. For example, in at least some embodiments, system 100 generates a line drop compensated output voltage from an input voltage supplied to system 100. The line drop compensated output voltage may be supplied to the load on the electrical wire, which, as described herein, may reduce the line drop compensated output voltage to a voltage substantially equal to the input voltage by the time the voltage reaches the load. In other words, the line drop compensated output voltage is reduced between system 100 and the load, such that a voltage to the load is substantially equal to the input voltage.

In the exemplary embodiment, shelving unit 102 may include any shelving unit, such as a lateral or tower shelving unit, arranged to receive one or more bypass modules 106 and/or one or more line drop compensating power converters 104. To this end, shelving unit 102 may include a plurality of slots or ports, each of which may be arranged to receive a bypass module 106 and/or a line drop compensating power converter 104. In at least one embodiment, shelving unit includes eight such slots or ports. Shelving unit 102 may also be arranged to receive an input voltage from a power supply, such as an AC-DC power converter that is electrically coupled to an AC power source. In the exemplary embodiment, shelving unit 102 routes the input voltage to each bypass module 106 carried by shelving unit 102.

Line drop compensating power converter 104 may include any power converter, such as any AC-DC power converter and/or any DC-DC power converter, configured to receive an input voltage and convert the input voltage to a line drop compensated output voltage. As described herein, a line drop compensated output voltage includes the input voltage plus an additional line drop voltage, such that, when the line drop compensated output voltage is supplied to a load over one or more electrical wires (or "lines"), the voltage provided to the load is substantially equal to the input voltage. In other words, line drop compensating power converter 104 adds an incremental line drop voltage to a received input voltage to compensate for a voltage line drop between line drop compensating power converter 104 and a load. In the exemplary embodiment, line drop compensating power converter 104 is a DC-DC power converter.

Figure 2:
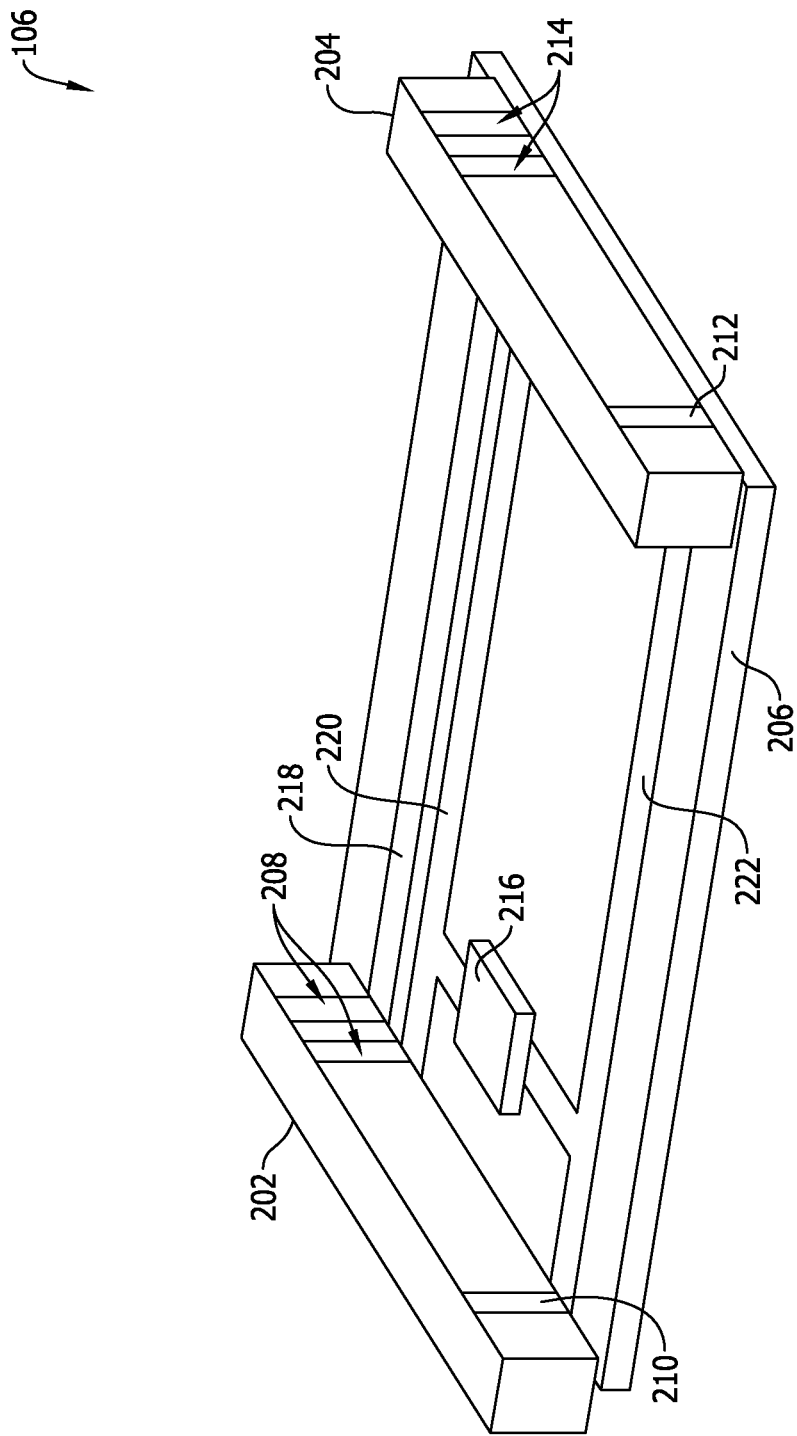
FIG. 2 is a perspective view of an exemplary bypass module of the system shown at FIG. 1.

FIG. 2 is a perspective view of an exemplary bypass module 106 of system 100 (shown at FIG. 1). A housing of bypass module 106 is removed, in FIG. 2, for clarity. In the exemplary embodiment, bypass module 106 includes a first side 202 (or a "shelf side"), a second side 204 (or a "line drop compensator power converter side"), and a printed circuit board 206 ("PCB") extending therebetween.

First side 202 includes an input terminal 208 configured to receive an input voltage from a power supply (and/or from a power supply connected to shelving unit 102). First side 202 also includes an output terminal 210 configured to receive a line drop compensated output voltage and/or an uncompensated output voltage from second side 204 (as described herein). Accordingly, input terminal 208 may be configured to connect to a power supply and/or shelving unit 102, such as, for example, to receive an input voltage from the power supply. Output terminal 210 may be configured to connect to a load and/or one or more electrical wires extending between output terminal 210 and a load (e.g., a radio of a cellular system, which may be separated from output terminal 210 by one or more electrical wires extending the height of a cellular system tower). For example, output terminal 210 may connect, via one or more electrical wires, to the load to supply the line drop compensated output voltage received from second side 204 to the load. As described below, output terminal 210 may also supply an uncompensated output voltage to the load (e.g., in the event that line drop compensating power converter 104 fails or is otherwise suffering from a loss of functionality).

Second side 204 includes an input terminal 212 configured to receive a line drop compensated output voltage from line drop compensating power converter 104. Second side 204 also includes an output terminal 214 configured to provide an input voltage received from first side 202 to line drop compensating power converter 104. Accordingly, input terminal 212 may be configured to connect to line drop compensating power converter 104, such as, for example, to receive a line drop compensated output voltage from line drop compensating power converter 104. Output terminal 214 may also be configured to connect to line drop compensating power converter 104, such as, for example, to supply an input voltage received from first side 202 to line drop compensating power converter 104.

A bypass switch 216, such as a MOSFET, a BJT, and/or any other suitable switching element, is mounted on PCB 206. In various embodiments, a microcontroller and/or computer processor, which may be mounted on PCB 206 or off-board, may be included in system 100 and configured to control bypass switch 216. In other embodiments, bypass switch 216 is configured to measure an output voltage on an output voltage bus (e.g., output voltage bus 222, as described below). For instance, bypass switch 216 may allow a voltage onto output voltage bus 222 based upon the presence or absence of a line drop compensated output voltage on the output voltage bus 222. For example, in at least one embodiment, bypass switch 216 may direct an input voltage onto output voltage bus 222 in response to detecting an absence of a line drop compensated output voltage on the output voltage bus 222.

Accordingly, PCB 206 includes a first input voltage bus 218, a second input voltage bus 220, and an output voltage bus 222. First input voltage bus 218 runs between and connects input terminal 208 of first side 202 to output terminal 214 of second side 204. First input voltage bus 218 is thus configured to relay an input voltage received from shelving unit 102 to line drop compensating power converter 104. Similarly, second input voltage bus 220 runs between and connects input terminal 208 of first side 202 to output terminal 214 of second side 204. However, second input voltage bus 220 also diverges on PCB 206 to supply the input voltage to bypass switch 216.

In like manner, output voltage bus 222 runs between and connects input terminal 212 of second side 204 to output terminal 210 of first side 202. Output voltage bus 222 is thus configured to relay an output voltage—such as a line drop compensated output voltage—received from line drop compensating power converter 104 to output terminal 210 of first side 202. As shown, output voltage bus 222 also diverges on PCB 206 connect to bypass switch 216.

Specifically, as described herein, output voltage bus 222 connects to bypass switch 216, such that bypass switch 216 is capable of switching the input voltage received from second input voltage bus 220 onto output voltage bus 222. It will be appreciated that bypass switch 216 is also capable of switching or blocking the input voltage received from second input voltage bus 220 to permit placement of a line drop compensated input voltage on output voltage bus 222. Thus, output voltage bus 222 is capable of carrying (depending upon the switched state of bypass switch 216) either of a line drop compensated output voltage received from line drop compensating power converter 104 and/or an input voltage received by bypass switch 216 from second input voltage bus 220.

Figure 3:
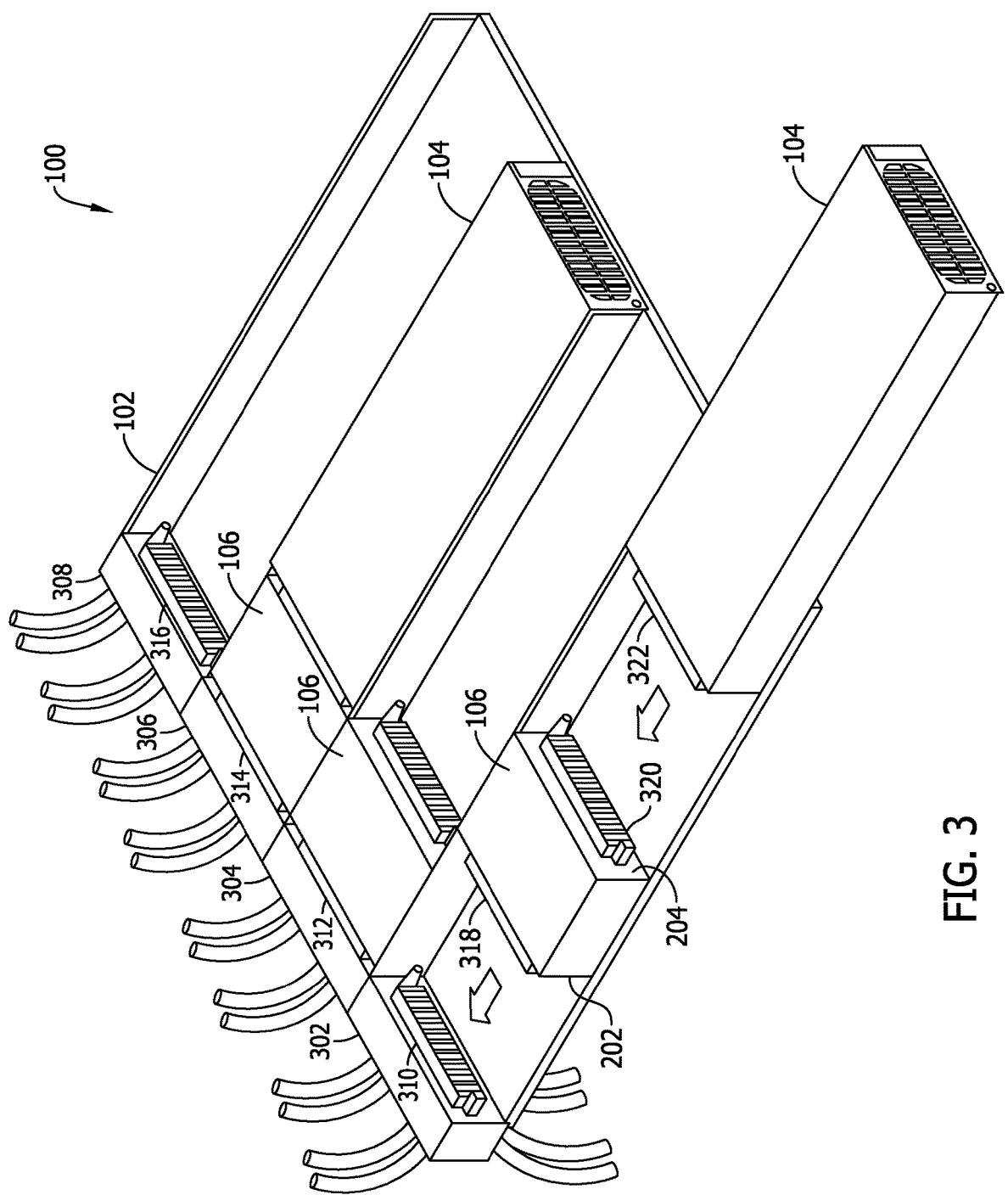
FIG. 3 is a perspective view of the system for compensating a line drop voltage shown at FIG. 1, in which a bypass module is physically interposed between a shelving unit and a line drop compensating power converter of the system.

FIG. 3 is a perspective view of system 100 (shown at FIG. 1), in which bypass module 106 is physically interposed between shelving unit 102 and line drop compensating power converter 104. As described herein, bypass module may be physically interposed between shelving unit 102 and line drop compensating power converter 104 to increase a power density (and/or reduce a form factor) of system 100.

More particularly, shelving unit 102 of system 100 may include a plurality of ports or slots, each of which may be capable of receiving a respective bypass module 106 and a respective line drop compensating power converter 104. In particular, each slot of shelving unit 102 may receive an in-line pair of one bypass module 106 and one line drop compensating power converter 104.

Thus, shelving unit 102 may include as many pairs of in-line bypass modules and line drop compensating power converters as there are slots available. As a result, system 100 may achieve substantial space savings, such as, for example, over systems in which a slot must be dedicated to a single component. A power density of system 100 may also be improved.

In the example shown at FIG. 3, shelving unit 102 includes a first slot 302, a second slot 304, a third slot 306, and a fourth slot 308. However, in other embodiments, shelving unit 102 may include any suitable number of slots, such as two slots, four slots, eight slots, ten slots, twelve slots, and the like. At FIG. 3, three bypass modules 106 and two line drop compensating power converters 104 are shown. However, it will be appreciated that each slot 302-308 may include a respective in-line pair of bypass modules 106 and line drop compensating power converters 104.

Each slot 302-308 of shelving unit 102 may, in the exemplary embodiment, include a connector. For example, first slot 302 may include a first connector 310, second slot 304 may include a second connector 312, third slot 306 may include a third connector 314, and fourth slot 308 may include a fourth connector 316. In various embodiments, connectors 310-316 may be male or female. In the example shown in FIG. 3, each connector 310-316 is female and is arranged to receive a respective male connector extending from a respective bypass module 106.

Each connector 310-316 is additionally configured to receive an input voltage from a power supply external to shelving unit 102 (as described herein). Likewise, as mentioned above, each connector 310-316 is configured to mate with a respective male and/or female connector of a respective bypass module 106.

Accordingly, each bypass module 106 includes a first connector 318 configured to mate with a connector of a respective slot 302-308 of shelving unit 102. Each of these first connectors 318 may electrically connect to first side 202 of a respective bypass module 106. For example, as shown with reference to first slot 302, bypass module 106 includes a first connector 318 extending from first side 202 and configured to mate with first connector 310 of first slot 302. In the example shown at FIG. 3, first connector 318 is a male connector and is arranged to mate with first connector 310 (which is female) of first slot 302.

Each bypass module 106 may, in addition, include a second connector 320 configured to mate with a connector of a respective line drop compensating power converter 104. For example, with continuing reference to first slot 302, bypass module 106 includes second connector 320 extending from second side 204. Similarly, at first slot 302, line drop compensating power converter 104 includes a connector 322 configured to mate with second connector 320 of bypass module 106. In the exemplary embodiment, each respective second connector 320 of bypass module 106 is a male connector, and each connector 322 of a respective line drop compensating power converter 104 is a female connector. However, it will be appreciated that other mating configurations are possible.

To couple a respective bypass module 106 and line drop compensating power converter 104 in-line, each component may slidably engage, via a respective connector, with a connector of another component. For instance, in slot 302 of shelving unit 102, first connector 318 of bypass module 106 may slidably engage with first connector 310 of shelving unit 210 to mechanically and electrically couple bypass module 106 to shelving unit 102. Likewise, second connector 320 of bypass module 106 may slidably engage with connector 322 of line drop compensating power converter 104 to mechanically and electrically couple bypass module 106 to line drop compensating power converter 104.

As a result, bypass module 106 and line drop compensating power converter 104 may be slidably coupled in-line within first slot 302 of shelving unit 102. In other words, bypass module 106 may be physically interposed within first slot 302 between shelving unit 102 and line drop compensating power converter 104. This pattern may be repeated for remaining slots 304-310 of shelving unit 102.

Further, because each component is capable of slidable engagement within a respective slot 302-310, one or more of these components may be easily removed, such as, for example, during maintenance and/or to replace a faulty or failed component. For example, in the event that a line drop compensating power converter 104 fails or otherwise suffers a loss of functionality requiring removal, a technician may simply slidably disengage the affected line drop compensating power converter 104 from bypass module 106. Likewise, any bypass module 106 of system 100 may be slidably disengaged from shelving unit 102 for replacement and/or maintenance.

Figure 4:
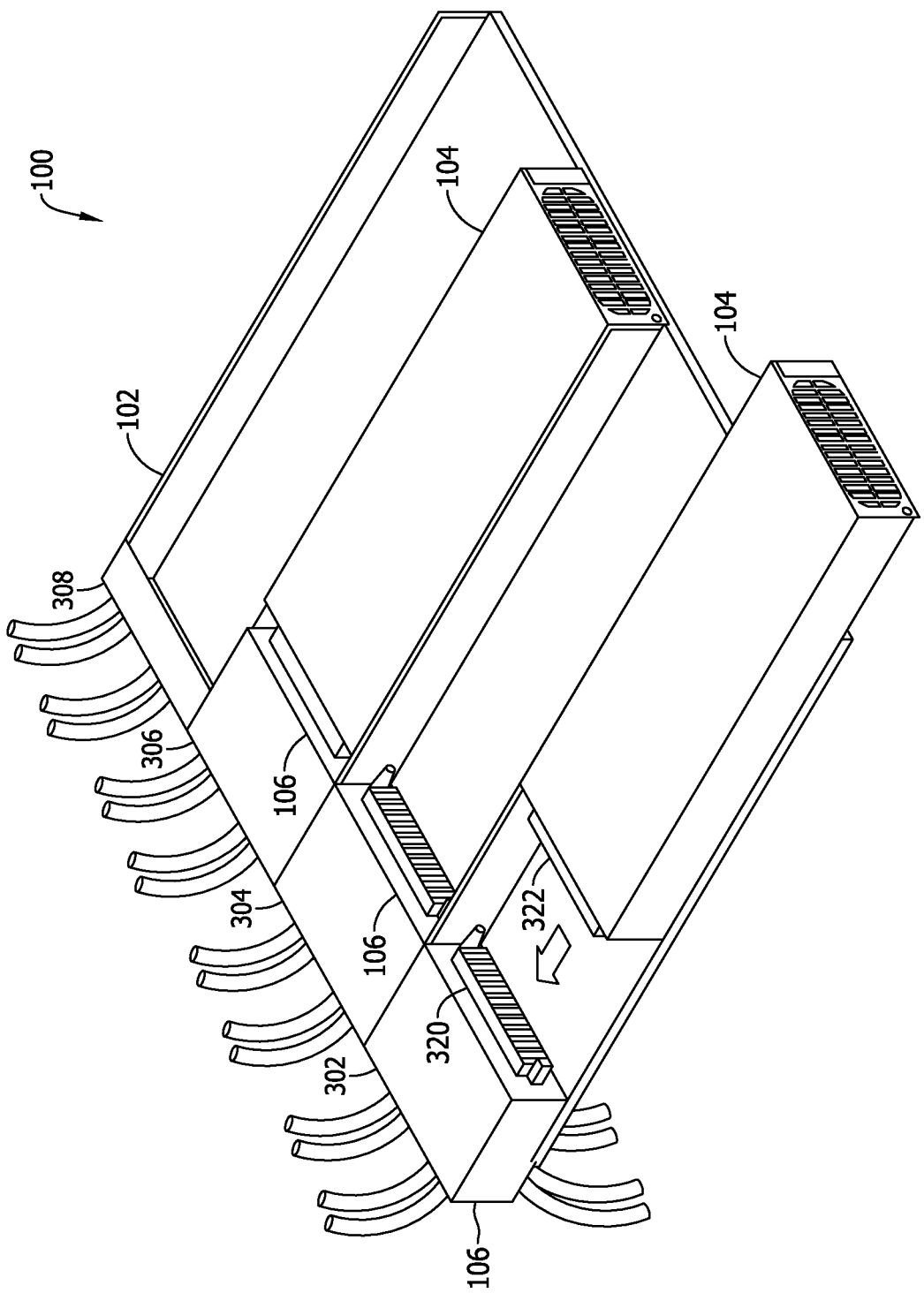
FIG. 4 is a perspective view of the system for compensating a line drop voltage shown at FIG. 1, in which a bypass module is incorporated in a shelving unit of the system.

FIG. 4 is a perspective view of an alternate arrangement for system 100 (shown at FIG. 1), in which a bypass module 106 may be physically incorporated within shelving unit 102. In this arrangement, each bypass module 106 may be integral to or monolithic with shelving unit 102, such that each bypass module 106 is not capable of slidable engagement with and disengagement from shelving unit 102.

One advantage of such an arrangement is that the form factor of system 100 may be further reduced. Specifically, physical incorporation of one or more bypass modules 106 with shelving unit 102 may require less space within shelving unit 102 than the use of one or more removable bypass modules (e.g., as described above with reference to FIG. 3). Apart from this physical difference, however, the arrangement shown at FIG. 4 is substantially identical (e.g., from an electrical point of view) to system 100 as described with respect to FIGS. 1, 2, and 3.

During operation, and with reference now to FIGS. 1-3, an input voltage may be supplied from a power supply (e.g., an AC mains and/or an AC-DC power converter coupled to an AC mains). Specifically, the power supply may feed the input voltage into each slot 302-308 of shelving unit 102, where the input voltage may be picked up by or relayed to a respective bypass module 106.

Each bypass module 106 may further relay the input voltage received from the power supply to a respective line drop compensating power converter 104, such as, for example, via either or both of first input voltage bus 218 and/or second input voltage bus 220.

In response to receiving the input voltage, each respective line drop compensating power converter 104 may, as described herein, incrementally increase the input voltage by a voltage line drop (which may be stored within or otherwise known by each line drop compensating power converter 104) to convert the input voltage to a line drop compensated output voltage. In addition, each line drop compensating power converter 104 may supply a line drop compensated output voltage to shelving unit 102, such as, for example, via output voltage bus 222. Shelving unit 102 may route each line drop compensated output voltage to a respective load, such as a respective radio of a cellular tower.

During transmission, each line drop compensated output voltage may decrease by an amount of the incremental voltage line drop added by a respective line drop compensating power converter 104, such that each load sees or receives a supply voltage substantially equal to the input voltage provided by the power supply to shelving unit 102.

Moreover, as described herein, in the event that a line drop compensating power converter 104 fails (or otherwise suffers a loss of functionality), bypass module 106 may switch or direct the input voltage supplied on second input voltage bus 220 onto output voltage bus 222. Specifically, as described above, bypass switch 216 may function to switch or direct the input voltage supplied on second input voltage bus 220 onto output voltage bus 222. In this manner, bypass module 106 may facilitate a bypass mode, in which the input voltage (rather than the line drop compensated output voltage) is supplied to the load in the event of a fault or failure of a line drop compensating power converter 104.

Figure 5:
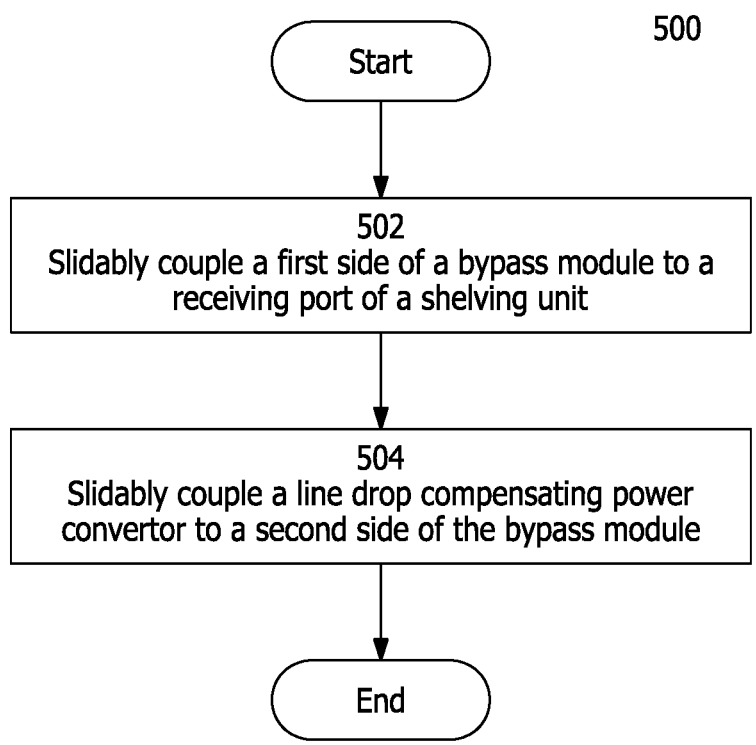
FIG. 5 is a flowchart illustrating a process for physically interposing a bypass module between a shelving unit and a line drop compensating power converter of the system shown at FIG. 1.

FIG. 5 is a flowchart illustrating a process 500 for physically interposing bypass module 106 between shelving unit 102 and line drop compensating power converter 104. In the exemplary embodiment, one or more bypass modules 106 may be slidably engaged in-line, as described above, with one or more slots 302-308 of shelving unit 102. Likewise, one or more line drop compensating power converters 106 may be slidably engaged in-line, as described above, with a respective bypass module 106. Further, as described above, each bypass module 106 and/or each line drop compensating power converter 104 may be slidably disengaged for maintenance, troubleshooting, and the like.

Embodiments of the systems and methods, as described above, thus facilitate a power-dense system of in-line bypass modules and line drop compensating power converters. In at least some embodiments, a shelving unit may receive and support a plurality of in-line pairs of bypass modules and line drop compensating power converters. Each bypass module may be configured to relay an input voltage received from an external power source to each line drop compensating power converter for conversion to a line drop compensated output voltage, which may be supplied to one or more loads. In the event that one or more line drop compensating power converters suffers a loss of functionality, the affected line drop compensating power converter(s) may be easily removed and/or replaced, and the input voltage received by the bypass module from the external power source may be provided to the load or loads supplied by the affected power converter(s).

Exemplary technical effects of the systems and methods described herein include, for example: (a) a power-dense system of in-line pairs of bypass modules and line drop compensating power converters; (b) a reduced form factor in association therewith; and (c) a mechanism permitting relatively simple removal and/or replacement of one or more line drop compensating power converters during operation of the system.

Exemplary embodiments of a system of in-line pairs of bypass modules and line drop compensating power converters and related components are described above in detail. The system is not limited to the specific embodiments described herein, but rather, components of systems and/or steps of the methods may be utilized independently and separately from other components and/or steps described herein. For example, the configuration of components described herein may also be used in combination with other processes, and is not limited to practice with the systems and related methods as described herein. Rather, the exemplary embodiment can be implemented and utilized in connection with many applications where line drop compensation is desired.

Although specific features of various embodiments of the present disclosure may be shown in some drawings and not in others, this is for convenience only. In accordance with the principles of the present disclosure, any feature of a drawing may be referenced and/or claimed in combination with any feature of any other drawing.

This written description uses examples to disclose the embodiments of the present disclosure, including the best mode, and also to enable any person skilled in the art to practice the disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system for compensating a voltage line drop, the system comprising:
   a shelving unit comprising at least one receiving port, said at least one receiving port comprising a unit connector;
   a power converter operable to generate a line drop compensated output voltage; and
   a bypass module including a pair of bypass module connectors disposed on opposing sides of said bypass module, said bypass module configured to selectively slidably engage, via said bypass module connectors, said unit connector and said power converter to establish a physical and electrical coupling between said shelving unit and said power converter, said bypass module operable to selectively switch between providing the line drop compensated output voltage from said power converter to a load and bypassing said power converter to provide an uncompensated output voltage to the load;
   wherein said power converter is operable to selectively slidably engage said shelving unit via said unit connector to provide the line drop compensated output voltage directly thereto when said bypass module is removed.

2. The system of claim 1, wherein said bypass module comprises:
   an input terminal configured to receive an input voltage; and
   an output terminal configured to provide the line drop compensated output voltage and the uncompensated output voltage to the load.

3. The system of claim 1, wherein said bypass module comprises:
   an input terminal configured to receive the line drop compensated output voltage from said power converter; and
   an output terminal configured to provide an input voltage to said power converter.

4. The system of claim 1, wherein said bypass module comprises:
   a first side configured to receive an input voltage from a power supply;
   a second side configured to receive the line drop compensated output voltage from said power converter; and
   a bypass switch electrically coupled between said first side and said second side.

5. The system of claim 4, wherein said bypass switch is configured to relay the input voltage from said first side to said second side for conversion by said power converter to the line drop compensated output voltage.

6. The system of claim 5, wherein said bypass switch is further configured to relay the line drop compensated output voltage received from said power converter to said first side in response to the line drop compensated output voltage being present on a voltage output bus.

7. The system of claim 6, wherein said bypass switch is further configured to relay the input voltage received from the power supply as the uncompensated output voltage back to said first side in response to the line drop compensated output voltage being absent on the voltage output bus while the power converter is connected to the bypass switch.

8. The system of claim 1, wherein said bypass module comprises a male connector, wherein said power converter comprises a female connector, and wherein said male connector of said bypass module is configured to removably engage said female connector of said power converter.

9. The system of claim 1, wherein said bypass module comprises a male connector, wherein said shelving unit comprises a female connector, and wherein said male connector of said bypass module is configured to removably engage said female connector of said shelving unit.

10. A bypass module for use with a power converter, said bypass module arranged to physically engage in-line between a connector of a shelving unit and the power converter, said bypass module comprising:
    a first side configured to receive an input voltage from a power supply;
    a second side configured to receive a line drop compensated output voltage from the power converter; and
    a bypass switch electrically coupled between said first side and said second side, said bypass switch operable to selectively switch between directing the line drop compensated output voltage from the power converter to a load and bypassing the power converter to direct an uncompensated output voltage to the load, wherein said bypass module, said power converter, and said power supply are configured to slidably and selectively engage one another such that said power converter is operable to directly engage said power supply when the bypass module is removed.

11. The bypass module of claim 10, wherein said bypass switch is configured to relay the input voltage from said first side to said second side for conversion by the power converter to the line drop compensated output voltage.

12. The bypass module of claim 11, wherein said bypass switch is further configured to relay the line drop compensated output voltage received from the power converter to said first side when the power converter is functional.

13. The bypass module of claim 12, wherein said bypass switch is further configured to relay the input voltage received from the power supply as the uncompensated output voltage back to said first side in response to a loss of functionality of the power converter.

14. The bypass module of claim 10, wherein said second side of said bypass module comprises a male connector configured to removably engage a female connector of the power converter.

15. A method for physically interposing a bypass module between a connector of a shelving unit and a power converter, said method comprising:
    slidably and selectively coupling a first side of the bypass module to the connector of the shelving unit;
    slidably and selectively coupling the power converter to a second side of the bypass module, wherein the bypass module includes a bypass switch electrically coupled between the first side of the bypass module and the second side of the bypass module, wherein the bypass switch is configured to:
      relay an input voltage received from a power supply from the first side to the second side for conversion by the power converter to a line drop compensated output voltage;
      relay the line drop compensated output voltage received from the power converter to the first side when the power converter is functional; and
      relay the input voltage received from the power supply as an uncompensated output voltage back to the first side in response to a loss of functionality of the power converter;
    wherein the power converter is operable to directly engage the power supply when the bypass module is removed.

16. The method of claim 15, wherein the bypass switch is powered by the input voltage received from the power supply.

17. The method of claim 15, wherein the bypass module includes a first input voltage bus that bypasses the bypass switch to transfer the input voltage to the second side, and wherein the bypass switch relays the input voltage to the second side via a second input voltage bus different from the first input voltage bus.

* * * * *